United States Patent [19]

Albrecht et al.

[11] Patent Number: 4,968,585

[45] Date of Patent: Nov. 6, 1990

[54] MICROFABRICATED CANTILEVER STYLUS WITH INTEGRATED CONICAL TIP

[75] Inventors: Thomas R. Albrecht; Shinya Akamine, both of Stanford; Mark J. Zdeblick, Los Altos Hills, all of Calif.

[73] Assignee: The Board of Trustees of the Leland Stanford Jr. University, Stanford, Calif.

[21] Appl. No.: 368,580

[22] Filed: Jun. 20, 1989

[51] Int. Cl.$^5$ .............................................. G03C 5/00
[52] U.S. Cl. ......................................... 430/320; 430/323; 430/324; 156/643; 156/651; 156/654; 156/659.1; 156/662; 369/170; 369/173
[58] Field of Search ................ 369/170, 173; 430/320, 430/323, 324; 156/643, 654, 659.1, 662, 651

[56] References Cited

U.S. PATENT DOCUMENTS

| | | | |
|---|---|---|---|
| 4,282,311 | 8/1981 | Dinardo | 430/318 |
| 4,284,712 | 8/1981 | James | 430/312 |
| 4,297,312 | 10/1981 | Carroll et al. | 264/134 |
| 4,916,002 | 4/1990 | Carver | 428/139 |

*Primary Examiner*—Jose Dees
*Attorney, Agent, or Firm*—Flehr, Hohbach, Test, Albritton & Herbert

[57] ABSTRACT

A cantilever stylus with an integrally formed conical tip is provided for atomic force microscopy AFM. The method for forming a stylus includes forming a circular masking pattern on the surface of a silicon substrate and anisotropically etching the silicon to form a post under the masking pattern. The post is then isotropically etched to produce a conical silicon tip mold. In one embodiment of the invention the silicon substrate and the conical silicon tip mold are thermally oxidized to form a cantilever stylus having including a cantilever arm with a conical tip fixed to its free end. In another embodiment of the invention the silicon substrate and the conical silicon tip mold are coated with a thin film of a dielectric material to form a cantilever stylus with a conical tip. In this embodiment the backside of the stylus is coated with a conductive material and a strong electric field is applied to the tip to cause electromigration of the conductive material to the point of the tip.

20 Claims, 4 Drawing Sheets

MICROFABRICATED CANTILEVER STYLUS WITH INTEGRATED CONICAL TIP

The U.S. Government has a paid-up license in this invention and the right in limited circumstances to require the patent owner to license others on reasonable terms as provided for by the terms of Contract No. N00014-84-K-0237 awarded by the Department of the NAVY.

BACKGROUND OF THE INVENTION

1. Field of the Invention.

This invention relates to microminiature tips and, more particularly, to microminiature tips formed using semiconductor integrated circuit fabrication techniques.

2. Prior Art.

An atomic force microscope (AFM) scans over the surface of a sample in two different modes of operation. In one mode, the contacting mode, a sharp tip is mounted on the end of a cantilever and the tip rides on the surface of a sample with an extremely light tracking force, on the order of $10^{-5}$ to $10^{-10}$ N. In the contacting mode of operation, profiles of the surface topology are obtained with extremely high resolution. Images showing the position of individual atoms are routinely obtained. In the other mode, the tip is held a short distance, on the order of 5 to 500 Angstroms, from the surface of a sample and is deflected by various forces between the sample and the tip, such forces include electrostatic, magnetic, and van der Waals forces.

Several methods of detecting the deflection of the cantilever are available with subangstrom sensitivity, including vacuum tunneling, optical interferometry, optical beam deflection, and capacitive techniques. However, fabrication of a readily reproducible cantilever stylus assembly has been a limiting factor on use of AFM and other forms of microscopy such as scanning tunneling microscopy.

The technical requirements for the cantilever-and-tip assembly include a number of different factors. A low force constant for the cantilever is desirable so that reasonable values of deflection are obtained with relatively small deflection forces. Typical values are 0.01–1000 N/m. A mechanical resonant frequency for the cantilever which is greater than 10 kHz is desirable to increase image tracking speed and to reduce sensitivity to ambient vibrations. Low force constants and high resonant frequencies are obtained by minimizing the mass of the cantilever.

When optical beam deflection is used to detect deflection of the cantilever, deflection sensitivity is inversely proportional to the length of the cantilever. Therefore a cantilever length of less than 1 mm. is desirable.

For certain types of deflection sensing, a high mechanical Q is desirable and is achieved by using amorphous or single crystal thin films for fabrication of the cantilever.

In many applications, it is desirable that the cantilever flex in only one direction and have high lateral stiffness. This can be obtained by using a geometry such as a V-shape which has two arms obliquely extending and meeting at a point at which the tip is mounted.

It is often required that a conductive electrode or reflective spot be located on the side of the cantilever opposite the tip. This is obtained by fabricating the cantilever from metal or depositing a conductor on certain portions of the cantilever to serve as a conductor or reflector.

Finally, a sharp tip, that is, a protruding tip with a tip radius less than 500 Angstroms and which may terminate in a single atom, is desired to provide good lateral resolution. The sharper the tip, the higher the resolution, especially when operating in the contact mode. This requirement has traditionally been one of the most difficult to obtain in a reproducible manner. Typically, in the prior art, tips were fabricated by hand using fabrication and bonding techniques which were time consuming and which produced non-uniformly performing tips.

In the prior art, cantilever arms were constructed by hand from fine wires. One way of obtaining a tip portion was to etch a wire to a point and to bend the point to extend perpendicularly from the wire. Another way to obtain a tip was to glue a tiny diamond fragment in place at the end of a cantilever. Prior art cantilevers fabricated using photolithographic techniques did not have integrally-formed sharp protruding tips. A rather dull tip was effectively obtained by using a corner of the microfabricated cantilever itself as a tip. Alternatively, a diamond fragment was glued by hand to the end of a microfabricated cantilever. The cantilever assembly of an AFM is relatively fragile and is virtually impossible to clean when it is contaminated by material from the surface being scanned so that frequent replacement is required.

Background information on well known prior art fabrication methods used in this invention can be found in the following references: Information on wet anisotropic Si etching and macromachining in general is described by K. E. Petersen, Proc. IEEE 70, 420 (1982). Isotropic and anisotropic dry plasma etching of Si and other materials is discussed in the book "Silicon Processing for the VLSI Era" by Wolf and Tauber. Inert ion etching, including ion milling, and many other aspects of microfabrication are discussed in the book "The Physics of Microfabrication" by Brodie and Muray. The electromigration phenomena exploited in the construction of dielectric tips with conducting metallic points is discussed in the book "VLSI Fabrication Principles" by Ghandhi. Information on the need for insulated STM tips is discussed by M. M. Dovek et al. in "Molecular Phenomena at Electrode Surfaces," *ACS Symposia Series*, edited by M. P. Soriga (in press).

Extremely high resolution profiles of surface topography can be obtained in the contacting mode of operation; in fact, images showing the positions of individual surface atoms are routinely obtained with the AFM. Therefore, a reproducible method for fabricating tips is a significant contribution to AFM technology.

SUMMARY OF THE INVENTION

It is therefore an object of the invention to provide a cantilever assembly having a microminiature tip fixed to the free end thereof for application in scanning tunnelling microscopy, atomic force microscopy, and in other applications requiring a microminiature sharp tip which is uniform, sharp, well-formed, durable, and inexpensive.

It is another object of the invention to provide a microminiature tip which is fabricated using semiconductor integrated circuit fabrication processes.

It is another object of the invention to provide a cantilever assembly for an AFM which is fabricated using microfabrication techniques.

In accordance with these and other objects of the invention, a cantilever stylus having an integrally-formed conical tip and a method for producing a cantilever stylus with an integral conical tip are provided according to the invention.

In accordance with these and other objects of the invention, a cantilever arm stylus with an integrally formed conical stylus is provided. The tip is formed by anisotropic dry etching of Si to form a Si post and subsequent sharpening of the post to a sharp tip by isotropic dry etching. This Si tip is incorporated into a thermally grown SiO2 layer from which the cantilever is made. Part of the Si substrate is removed to free up the cantilever. Alternatively, the cantilever and tip may be formed of other materials, such as Si3N4, Al2O3, deposited SiO2, Au, silicon, or polysilicon. The cantilever may also be made from a different material than the tip. One variation is also described which produces tips with conducting metallic point surrounded by dielectric material.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
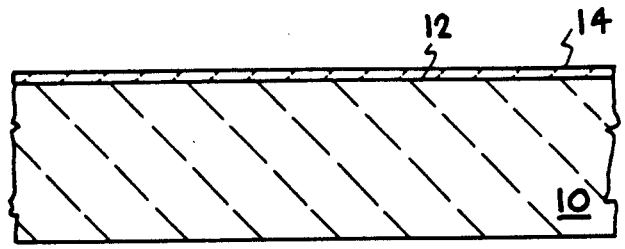
FIGS. 1 through 5 are cross-sectional views showing the results of various process steps for forming a sharp conical tip on the surface of a silicon wafer.

FIG. 1 shows the first step in a process, which starts with a silicon wafer, or substrate, 10. Deposited on the surface 12 of the silicon wafer 10 is a thin film 14 of suitable masking material. An example of such a masking film layer 14 is a 1000 Å film of thermally grown SiO2.

Figure 2:
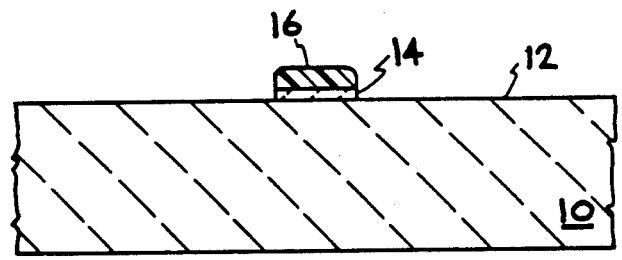

FIG. 2 shows photoresist patterned into a small, preferably circular shaped, spot 16 several microns in diameter formed on the surface of the masking layer 14. The masking layer 14 is shown etched away except for the remaining area under the photoresist spot 16. The size of the spot determines the approximate diameter of the base of a substantially conical tip which is to be formed. Note that the photoresist spot and the remainder of the masking layer 14 do no need to be perfectly circular. A photoresist pattern which deviates from a circular pattern, such as a square or a somewhat oblong pattern is acceptable to produce a cantilever tip having a generally conical shape.

Figure 3:
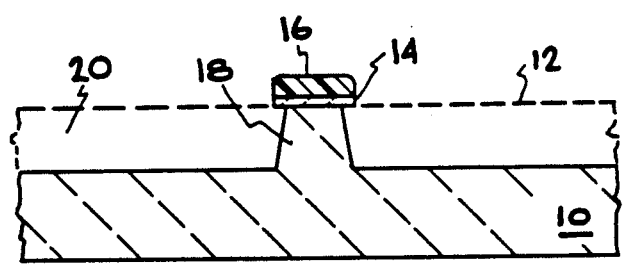

FIG. 3 shows the formation of a Si post 18 on the remaining surface of the wafer 10 formed by etching away several microns of Si 20 from the wafer's original surface 12. An anisotropic dry etch is used to obtain steep sidewalls on the post 18. The photoresist spot 16 and the remainder of the masking layer 14 improve the anisotropy of this etch. The depth of this etch should exceed the desired height of the conical tip which is to be formed.

Figure 4:
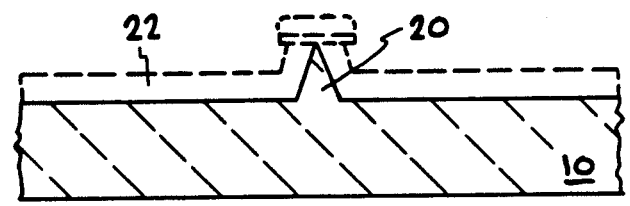

FIG. 4 shows the sharpening of the post 18 into a conical tip 20. First the photoresist spot 16 is removed, followed by isotropic dry etching of the top layer 22 of the silicon substrate until the remainder of the masking layer 14 detaches from what is left of the post 18. This forms a substantially conical tip mold 20. The slope of the sidewalls of the tip 18 can be adjusted by varying the ratio of the depth of the anisotropic etch used to form the post 18 and the amount of isotropic etching used to sharpen the post into the tip mold 20. This completes formation of the silicon tip mold 20.

Note that the silicon post 18 can have a shape which deviates from cylindrical, depending on the pattern of the masking layer 14. The shape of the post 18 is intended to include a variety of shapes.

Figure 5:
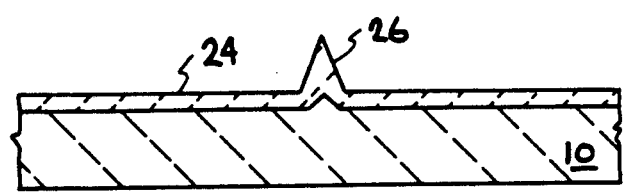

FIG. 5 shows an SiO2 layer, or film, 24 formed by growing an oxide out of the Si on the surface of the wafer, including the tip mold portion 20 shown in FIG. 4. The SiO2 is formed from the Si by thermal oxidation, which preserves the approximate shape of the original Si surface and tip mold 20. Thus, the sharp Si tip mold 20 serves to form an equally sharp SiO2 tip 26. SiO2 also forms on the bottom side of the substrate 10.

Figure 6A:
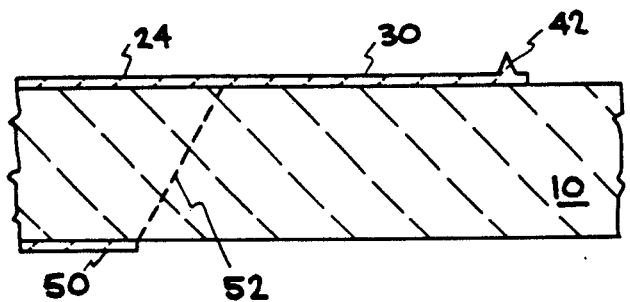
FIG. 6A is a cross-sectional view showing a thermally-grown SiO2 film patterned on a silicon wafer to form a V-shaped cantilever stylus with an integral conical tip.
Figure 6B:
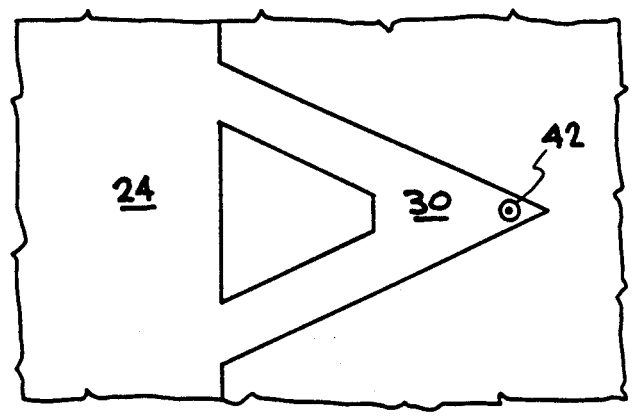
FIG. 6B is a plan view of the stylus and integral tip of FIG. 6A.

FIGS. 6A and 6B (in a plan view) show how the SiO2 film 24 is formed into a cantilever. The top SiO2 film 24 is patterned photolithographically into the shape of a cantilever 30. The cantilever 30 is V-shaped in the drawing, but may be of any suitable shape, such as rectangular. The cantilever 30 is patterned so that a tip 42 is located at the end of the cantilever. The bottom SiO2 film 50 is patterned as shown so that an anisotropic etch of the Si wafer 10 in a subsequent step can self-terminate and retain part of the wafer 10 at the base of the cantilever 30. This requirement is met by patterning the edge of the bottom SiO2 film 50 to lie in a Si (111) plane 52 which also intersects the base of the cantilever 40.

Figure 7:
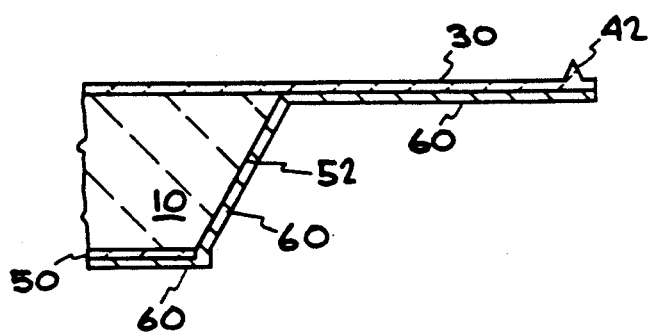
FIG. 7 is a cross-sectional view of a finished cantilever stylus assembly.

FIG. 7 shows a finished cantilever stylus assembly, consisting of a sharp conical tip 42 located at the free end of a SiO2 cantilever 30 which is attached at its base to a retained part of the Si wafer 10. An anisotropic Si etch is used to remove the part of the wafer 10 located under the cantilever 30. This etch self-terminates at the (111) plane 52 in the Si. The bottom side of the cantilever 30 and the retained part of the wafer 10 are coated with a conductive metal coating 60 for detecting displacement in an AFM.

Since each cantilever stylus structure is quite small (typical size 100×100 microns), hundreds of cantilevers can be constructed simultaneously on a single Si wafer, taking advantage of the excellent reproducibility and the low unit cost available from batch-processing fabrication techniques.

A number of variations are possible in the fabrication process. For example, the initial masking $SiO_2$ film 14 can be replaced with any material suitable as a mask for the anisotropic dry etch used to form the Si post 18. $Si_3N_4$, deposited $SiO_2$, and Al are suitable examples. The thickness of the masking film is not very important. There are a variety of dry etchants which can be used to form steep sidewalls in Si. One example is $SF_6/C_2ClF_5$ plasma with photoresist present.

The Si post 18 is alternatively sharpened into a sharp tip mold 26 by inert ion milling instead of using a reactive ion plasma etch. Ion milling is known to sharpen and accentuate any surface protrusions and sharpen the post 18 into a conical tip as desired.

Figure 8:
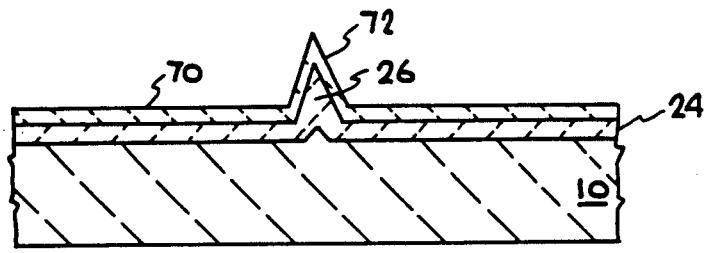
FIGS. 8 through 10 are cross-sectional views showing the results of an embodiment of the invention in which the cantilever arm and the integral conical tip are formed of materials deposited on a silicon substrate and a conical silicon tip mold.
Figure 9:
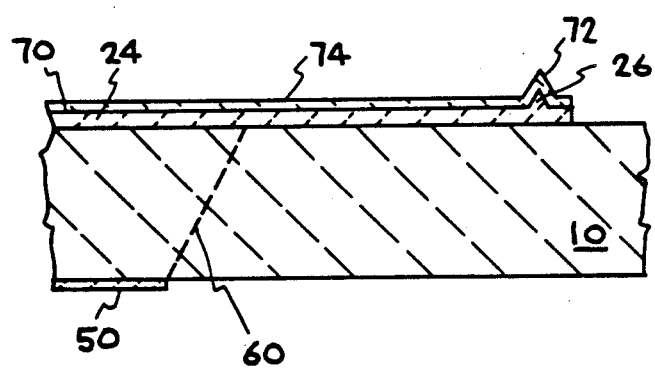
Figure 10:
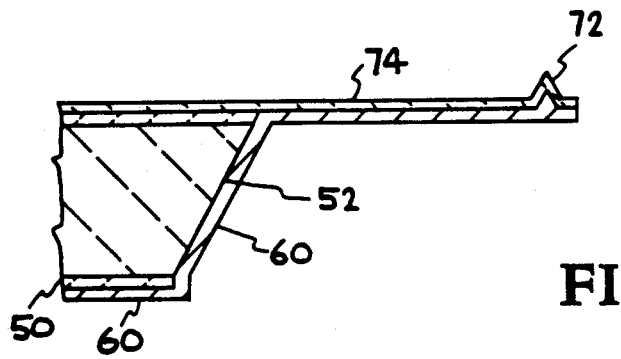

FIGS. 8,9,10 show an alternative embodiment of the invention in which the cantilever and its tip are formed of deposited material rather than of thermally grown oxide. much as possible, the final tip 42 is formed by thermal oxidation of the Si tip mold 20. However, the final tip 42 and cantilever 30 can be made of other suitable deposited thin film materials, including, for example, $Si_3N_4$, deposited $SiO_2$, $Al_2O_3$, Al, or Au. When deposited films are used, the Si tip mold 20 serves as a form around which a deposited film is cast into the approximate shape of the tip mold 26 to provide a cantilever tip 42 which is integrally formed with a cantilever arm 74. The Si tip mold 26 is later removed along with the rest of the Si substrate under the cantilever. This method differs from the oxidation method where the Si tip mold material is transformed directly into the $SiO_2$ tip. $Si_3N_4$ is a particularly good material, since its high strength and low internal stress yield very robust and durable cantilevers.

Figure 11:
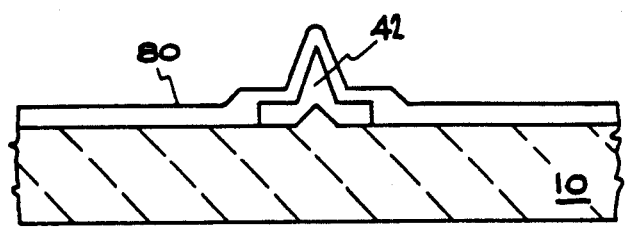
FIGS. 11 through 13 are cross-sectional views showing the results of an alternative embodiment of the invention in which the cantilever arm is made from a different material than the tip.
Figure 12:
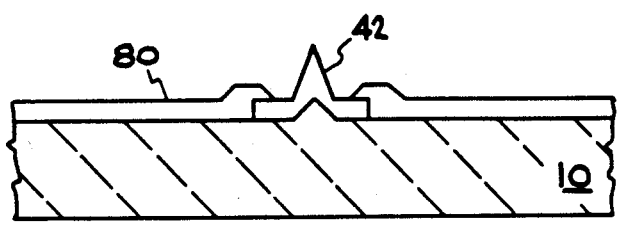
Figure 13:
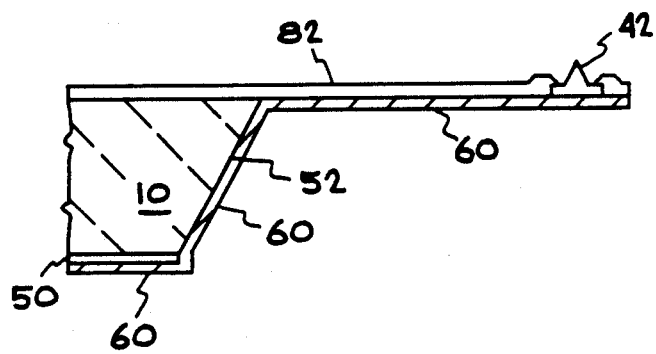

FIGS. 11 through 13 show another embodiment which preserves the sharpness of the $SiO_2$ tip mold in a scanning tip which has the durability of a cantilever arm made of another material, such as $Si_3N_4$. This embodiment starts with the structure as shown in FIG. 5. All of the $SiO_2$ layer 24 is removed except a small region around and including the tip 42. Then the entire surface of the wafer 10 including the tip 42 is coated with a layer 80 of $Si_3N_4$ as is shown in FIG. 11. FIG. 12 shows the next step, which is the removal of the $Si_3N_4$ film 80 from over the tip 42 leaving a small overlap at the boundary to improve adhesion of the tip 42 to the film 80. The cantilever stylus assembly with a cantilever arm 82 is completed as described previously, except that the $Si_3N_4$ film 80 takes the place of the $SiO_2$ film 24 in the remaining steps. The $SiO_2$ tip 42 remains intact in the finished product, which is shown in FIG. 13.

In any of the variations described above, the size and shape of the cantilever, and the size and aspect ratio of the tip can be varied over a large range.

One of the embodiments of the invention details the construction of dielectric tips with conducting metallic points. The point of the conical tip structure is conductive, but the rest of the tip structure is insulating. A connection is provided by electromigration of conductive material through the end of the tip so that an electrical current can flow through to the point. This structure is a microfabricated version of the type of tips used in scanning tunneling microscopy (STM) operated in electrolytes, where the ion current would be too large if the entire tip structure were metallic. Insulating everything except the very point reduces the ionic current so that the tunneling current from the point of the structure can be easily detected and controlled. Previous fabrication methods for this type of tip involve coating tips formed from wires with glass or polymer coatings on a one-at-a-time basis.

Figure 14:
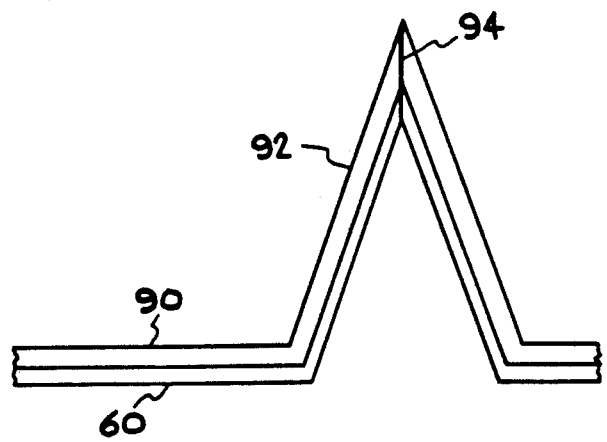
FIG. 14 shows a variation of the invention in which electromigration is used to draw a narrow filament of metal through a dielectric conical tip to produce a conducting point surrounded by insulating material.

This variation of the invention is shown in FIG. 14. In this case, a cantilever 90 and a tip 92 are made of a thin dielectric layer by either the thermal growth of $SiO_2$ or deposition of any dielectric material as described hereinabove. The dielectric film should be thin enough so that its thickness is much less than the height or diameter of the tip. As in the previous first embodiments, the back of the cantilever and tip is coated with a metal layer 60. Electromigration is used to draw a narrow filament of metal 80 through the dielectric film at the point of the conical tip. This is accomplished in a simple manner by applying a high voltage (several kV) between the metal film 60 and a planar electrode located above the tip up to several cm away. Raising the temperature of the tip speeds up the process. The electric field is greatly enhanced by the sharpness of the metal cone formed under the dielectric cone, and this field causes electromigration of metal along a path 94 through the dielectric to the surface of the dielectric at the point. This forms a conducting tip surrounded by insulating material suitable for use in the STM for electrochemistry applications.

This new method offers significant advantages because the shape of the tip is highly symmetric and its height and aspect ratio can be controlled.

The fabrication process presented here is a batch fabrication process which permits the construction of a sharp conical tip as an integral part of the entire cantilever fabrication process. Since this process is capable of producing hundreds of identical structures simultaneously on a silicon wafer, cantilever arms having conical tips are easily reproduced in large quantities.

The concept of microfabricating thin-film cantilevers itself is not new. Nor is their application in an AFM new. (although this occurred in our lab first). What is new is the method of fabricating a sharp conical tip and the inclusion of the conical tip as an integral part of the cantilever fabrication process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method of forming a silicon tip, comprising the steps of:
    forming a masking layer having a predetermined masking pattern on a portion of the surface of a silicon substrate;

anisotropically etching said silicon substrate to form a silicon post on said silicon substrate beneath said masking pattern; and isotropically etching said silicon post to form a pointed silicon tip.

2. A method of forming a cantilever stylus with an integral pointed tip, comprising the steps of:

forming a masking layer having a predetermined masking pattern on a portion of the surface of a silicon substrate;

anisotropically etching said silicon substrate to form a silicon post on said silicon substrate beneath said masking pattern;

isotropically etching said silicon post to form a pointed silicon tip on said silicon substrate;

forming a cantilever stylus which includes a cantilever arm and said pointed silicon tip fixed thereto;

selectively removing selected portions of the silicon substrate to release said cantilever stylus from said silicon substrate.

3. The method of claim 1 wherein the step of forming the cantilever stylus includes the steps of:

thermally oxidizing said pointed silicon tip and a patterned portion of said silicon substrate to form a silicon dioxide cantilever stylus.

4. The method of claim 1 wherein the step of forming the cantilever stylus includes the step of depositing a thin film material over said pointed silicon tip and patterned portions of said silicon substrate to form a cantilever stylus of said thin film material.

5. The method of claim 4 wherein the step of depositing a thin film over said pointed silicon tip and portions of said silicon substrate to form a cantilever stylus includes using a thin film material selected from the group consisting of silicon nitride, deposited silicon dioxide, aluminum, aluminum oxide, gold, and polysilicon.

6. The method of claim 1 wherein the step of forming the cantilever stylus includes the step of:

forming a thin film of a first material over said pointed silicon tip and adjacent areas of said silicon substrate to thereby provide a stylus tip;

forming a thin film of a second material over portions of said silicon substrate and areas of said silicon substrate adjacent to said stylus tip to form a cantilever arm of said second material with said stylus tip fixed thereto.

7. The method of claim 6 wherein said first material is thermally grown $SiO_2$ and said second material is $Si_3N_4$.

8. The method of claim 1 wherein the step of forming a masking pattern on the silicon substrate includes the steps of:

depositing a masking layer on the silicon substrate;

forming a pattern of photoresist material on said masking layer;

removing portions of said masking layer to leave said masking pattern on said silicon substrate.

9. The method of claim wherein said masking pattern is circular and approximately 1 micrometer in diameter.

10. The method of claim 1 wherein the step of anisotropically etching the silicon substrate is done by dry etching.

11. The method of claim 1 wherein the step of anisotropically etching includes etching the silicon substrate to a predetermined depth.

12. The method of claim 1 including the step of etching away said silicon post until the masking layer is detached from the silicon substrate.

13. The method of claim 1 wherein the step of isotropically etching the silicon post includes the step of controlling the slope of the sidewall of the conical tip by varying the ratio between the depth of anisotropic etching for the silicon post and the amount of isotropic etching used to etch the silicon post into a pointed silicon tip, and by controlling the anisotrophy of the etching.

14. The method of claim 1 wherein the step of isotropically etching the silicon post includes etching said post with a reactive ion plasma.

15. The method of claim 1 wherein the step of isotropically etching the silicon post includes etching said post by ion milling.

16. The method of claim 1 wherein said masking layer is selected from the group consisting of thermally grown silicon dioxide, silicon nitride, deposited silicon dioxide, aluminum, or photoresist material.

17. The method of claim 1 wherein the step of anisotropically etching the silicon substrate to form a silicon post includes using an etchant selected from the group consisting of $SF_6/C_2ClF_5$, $CF_4$, and $SF_6$ plasma.

18. The method of claim 1 including the steps of:

forming the stylus tip to have a thickness which is less than its height and diameter;

coating the backside of the stylus tip with a conductive material to form a conductive layer;

applying a voltage between the conductive layer and an electrode spaced apart from the point of said stylus tip to cause electromigration of said conductive material through said dielectric material to the point of said stylus tip to provide a conductive stylus tip.

19. The method of claim 1 including forming a plurality of cantilever styluses with integral tips on various portions of the surface of said silicon substrate.

20. The method of claim 1 wherein the masking pattern is shaped in a substantially circular pattern to form a substantially cylindrical silicon post which results in a substantially conical pointed tip.

* * * * *